United States Patent
Chen et al.

(10) Patent No.: US 10,127,995 B2
(45) Date of Patent: Nov. 13, 2018

(54) SHIFT REGISTER UNIT AND METHOD FOR DRIVING THE SAME, CORRESPONDING GATE DRIVING CIRCUIT AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Mo Chen, Beijing (CN); Jian Zhao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/526,315

(22) PCT Filed: May 30, 2016

(86) PCT No.: PCT/CN2016/083888
§ 371 (c)(1),
(2) Date: May 11, 2017

(87) PCT Pub. No.: WO2017/161678
PCT Pub. Date: Sep. 28, 2017

(65) Prior Publication Data
US 2018/0061508 A1 Mar. 1, 2018

(30) Foreign Application Priority Data
Mar. 22, 2016 (CN) .......................... 2016 1 0166436

(51) Int. Cl.
*G11C 19/28* (2006.01)
*G09G 3/36* (2006.01)

(52) U.S. Cl.
CPC .......... *G11C 19/28* (2013.01); *G09G 3/3677* (2013.01); *G09G 2310/0286* (2013.01)

(58) Field of Classification Search
CPC .. G09G 3/3648; G09G 3/3674; G09G 3/3677; G09G 2310/0286; G09G 2310/08; G11C 19/28
See application file for complete search history.

(56) References Cited

U.S. PATENT DOCUMENTS 9,064,592 B2 * 6/2015 Shang .................. G09G 3/20
9,336,898 B2 * 5/2016 Kong ................... G09G 3/3674
(Continued)

FOREIGN PATENT DOCUMENTS

CN 101677021 A 3/2010
CN 102708818 A 10/2012
(Continued)

OTHER PUBLICATIONS

Office Action in Chinese Application No. 201610166436.7 dated Jul. 31, 2017, with English translation.
(Continued)

*Primary Examiner* — Patrick O'Neill
(74) *Attorney, Agent, or Firm* — Womble Bond Dickinson (US) LLP

(57) ABSTRACT

The disclosure discloses a shift register and a method for driving the same, a corresponding gate driving circuit and a display device. In the shift register, a pull-up driving unit is connected with a pull-up unit via a pull-up node, a discharge auxiliary unit is used for pulling low the potential of the pull-up node according to a discharge control signal, a discharge driving unit is used for pulling high the potential
(Continued)

of a gate line connected with the signal output terminal of the shift register according to the discharge control signal, and a reset unit is further used for pulling low again the potential of the gate line connected with the signal output terminal of the shift register, after the discharge driving unit pulls high the potential of the gate line and the outputting of it finishes.

14 Claims, 4 Drawing Sheets

(56) References Cited

U.S. PATENT DOCUMENTS

| | | | | |
|---|---|---|---|---|
| 9,449,542 | B2* | 9/2016 | Zhang | G09G 3/36 |
| 9,455,688 | B2* | 9/2016 | Ma | G09G 3/3622 |
| 9,824,659 | B2* | 11/2017 | Gu | G09G 3/3677 |
| 2014/0072093 | A1 | 3/2014 | Shang et al. | |
| 2014/0177780 | A1 | 6/2014 | Qi et al. | |
| 2015/0029082 | A1 | 1/2015 | Jeon et al. | |
| 2016/0293091 | A1 | 10/2016 | Wang | |
| 2016/0322115 | A1 | 11/2016 | Xu et al. | |
| 2017/0046998 | A1 | 2/2017 | Zhang et al. | |
| 2017/0076680 | A1* | 3/2017 | Li | G09G 3/3648 |
| 2017/0102814 | A1* | 4/2017 | Xu | G06F 3/0412 |
| 2017/0309240 | A1* | 10/2017 | Zhang | G09G 3/3677 |

FOREIGN PATENT DOCUMENTS

| | | |
|---|---|---|
| CN | 103050106 A | 4/2013 |
| CN | 104361869 A | 2/2015 |
| CN | 104616617 A | 5/2015 |
| CN | 104766586 A | 7/2015 |
| CN | 105590612 A | 5/2016 |

OTHER PUBLICATIONS

International Search Report and Written Opinion in PCT/CN2016/083888 dated Dec. 23, 2016, with English translation. 15 pages.

* cited by examiner

SHIFT REGISTER UNIT AND METHOD FOR DRIVING THE SAME, CORRESPONDING GATE DRIVING CIRCUIT AND DISPLAY DEVICE

RELATED APPLICATIONS

The present application is the U.S. national phase entry of PCT/CN2016/083888, with an international filing date of May 30, 2016, which claims the benefit of Chinese Patent Application No. 201610166436.7 filed on Mar. 22, 2016, the entire disclosures of which are incorporated herein by reference.

TECHNICAL FIELD

The disclosure relates to the filed of display technology, and in particular, to a shift register and a method for driving the same, a corresponding gate driving circuit and a display device.

BACKGROUND

In the filed of flat display, liquid crystal display devices have been widely applied in end display apparatuses of various sizes due to their characteristics such as light weight, small volume and thin thickness, etc. The display panel of a traditional liquid crystal display device is constituted by an array substrate and a liquid crystal layer sandwiched between opposite substrates, and on the array substrate is arranged a vertical and horizontal array type pixel matrix, wherein the pixel structure of the array substrate comprises a thin film transistor (TFT) and a pixel electrode, and the pixel electrode and the common electrode constitute a capacitor, and the TFT inputs a different voltage to the pixel electrode under the control of crossed data lines and scanning lines, a different electric field is therefore formed on the liquid crystal capacitor, and the electric field controls the liquid crystal deflection and accomplishes the display function of the panel.

With the development of technology, there appears a gate driver on array (GOA) technique. The GOA technique is one that integrates a scanning circuit onto an array substrate, and as a shift register, each GOA unit successively passes a scanning signal to a next GOA unit to turn on TFT switches line by line and accomplish data signal input of pixel units. A gate driving circuit of the GOA technique comprises a plurality of signal lines for providing a signal(s) and a shift register for storing signal data. As shown in FIG. 1, for ease of illustration, a signal line is marked with a signal which is transferred by the signal line as follows.

The signal lines comprise a trigger signal line for inputting an initial trigger signal STV to a shift register, a pull-low signal line for inputting a low level signal VSS to a shift register, a first clock signal line and a second clock signal line for providing a shift register with complementary clock pulse signals, namely, a first clock signal CLK and a second clock signal CLKB.

The shift register comprises a pull-up driving unit, a pull-up unit, a pull-down driving unit, a pull-down unit and a reset unit.

The pull-up driving unit is connected to the trigger signal line for transferring the trigger signal STV, to the second clock signal line for transferring the second clock signal CLKB, and to a pull-up node PU, the pull-up unit is connected to the first clock signal line for transferring the first clock signal CLK, the pull-up node and an output signal terminal, the pull-down driving unit is connected to the second clock signal line, the pull-up node PU, a pull-down node PD and a low level signal terminal VSS, the pull-down unit is connected to the second clock signal line, the pull-up node PU, the pull-down node PD, the low level signal terminal VSS and the output signal terminal, and the reset unit is connected to the pull-up node PU, the pull-down node PD, the low level signal terminal VSS and a reset signal line for transferring a reset signal.

However, when the gate driving circuit comprising a shift register as described above scans, it is necessary to change the direction of the electric field on the liquid crystal capacitor (i.e., polarity reversal) for each frame, and during the polarity reversal, due to the leakage of the TFT and the crosstalk of the parasitic capacitance, it will result in that the positive and negative charges on both electrodes of the liquid crystal capacitor may not be completely offset, and residual DC charges are accumulated on the electrodes, which affect the liquid crystal deflection and thereby form a residual image.

SUMMARY

An embodiment of the disclosure provides a shift register comprising a pull-up driving unit, a pull-up unit, a pull-down unit, a pull-down driving unit and a reset unit, the pull-up driving unit being connected with the pull-up unit via a pull-up node, the reset unit being used for pulling low the potential of a gate line connected with a signal output terminal of the shift register after normal outputting by the shift register finishes, the shift register further comprising a discharge auxiliary unit, a discharge driving unit and a discharge control signal terminal, wherein the discharge auxiliary unit is used for pulling low the potential of the pull-up node according to a discharge control signal inputted by the discharge control signal terminal, the discharge driving unit is used for pulling high the potential of the gate line connected with the signal output terminal of the shift register according to the discharge control signal inputted by the discharge control signal terminal, and the reset unit is further used for pulling low again the potential of the gate line connected with the signal output terminal of the shift register, after the discharge driving unit pulls high the potential of the gate line connected with the signal output terminal of the shift register and the outputting of it finishes.

In the embodiment of the disclosure, the shift register is arranged with the discharge auxiliary unit and the discharge driving unit, such that after the scanning by the gate driving circuit finishes, the discharge driving unit can, according to the control of the discharge control signal, pull high the potential of the gate line connected with the signal output terminal of the shift register and output it, and it is pulled low again by the reset unit.

Optionally, the pull-up driving unit comprises a first thin film transistor and a second thin film transistor, the gate and the drain of the first thin film transistor and the drain of the second thin film transistor are electrically connected with a trigger signal terminal, the source of the first thin film transistor and the source of the second thin film transistor are electrically connected with the pull-up node, and the gate of the second thin film transistor is electrically connected with a second clock signal terminal, the pull-up unit comprises a third thin film transistor and a capacitor, the gate of the third thin film transistor and a first terminal of the capacitor are electrically connected with the pull-up node, the drain of the third thin film transistor is electrically connected with a first clock signal terminal, and the source of the third thin film transistor and a second terminal of the capacitor are electrically connected with the signal output terminal, the pull-down unit comprises a fourth thin film transistor, a fifth thin film transistor and a sixth thin film transistor, the gate of the fourth thin film transistor and the gate of the fifth thin film transistor are electrically connected with the pull-down node, the drain of the fourth thin film transistor is electrically connected with the pull-up node, the source of the fourth thin film transistor, the source of the fifth thin film transistor and the source of the sixth thin film transistor are electrically connected with a low level signal terminal, the drain of the fifth thin film transistor and the drain of the sixth thin film transistor are electrically connected with the signal output terminal, and the gate of the sixth thin film transistor is electrically connected with the second clock signal terminal, the pull-down driving unit comprises a seventh thin film transistor, an eighth thin film transistor, a ninth thin film transistor and a tenth thin film transistor, the gate and the drain of the seventh thin film transistor and the drain of the eighth thin film transistor are electrically connected with the second clock signal terminal, the source of the seventh thin film transistor, the gate of the eighth thin film transistor and the drain of the ninth thin film transistor are electrically connected, the source of the eighth thin film transistor and the drain of the tenth thin film transistor are electrically connected with the pull-down node, the gate of the ninth thin film transistor and the gate of the tenth thin film transistor are electrically connected with the pull-up node, and the source of the ninth thin film transistor and the source of the tenth thin film transistor are electrically connected with the low level signal terminal, and the reset unit comprises an eleventh thin film transistor and a twelfth thin film transistor, the gate of the eleventh thin film transistor and the gate of the twelfth thin film transistor are electrically connected with a reset signal terminal, the drain of the eleventh thin film transistor is electrically connected with the pull-up node, the source of the eleventh thin film transistor and the source of the twelfth thin film transistor are electrically connected with the low level signal terminal, and the drain of the twelfth thin film transistor is electrically connected with the signal output terminal.

Optionally, the discharge auxiliary unit comprises a thirteenth thin film transistor, the gate of the thirteenth thin film transistor is connected with the discharge control signal terminal, the drain of the thirteenth thin film transistor is connected with the pull-up node, and the source of the thirteenth thin film transistor is electrically connected with the low level signal terminal.

Optionally, the discharge driving unit comprises a fourteenth thin film transistor, the gate of the fourteenth thin film transistor is electrically connected with the discharge control signal terminal, the drain of the fourteenth thin film transistor is electrically connected with the first clock signal terminal, and the source of the fourteenth thin film transistor is electrically connected with the signal output terminal.

Optionally, all of the above thin film transistors are N-type thin film transistors.

An embodiment of the disclosure further provides a gate driving circuit comprising a plurality of cascaded shift registers, and the shift register is one as described in any of the above embodiments.

Optionally, the gate driving circuit further comprises a discharge control signal line for providing the discharge control signal terminal of the shift register with a discharge control signal to control the discharge auxiliary unit and the discharge driving unit, and the discharge control signal is kept at a low level during the scanning by the gate driving circuit, and provides a high level of a clock cycle after the scanning by the gate driving circuit finishes, which clock cycle is the cycle of the clock signal in the shift register.

An embodiment of the disclosure further provides a display device comprising the gate driving circuit as provided by the above embodiment.

In the embodiment of the disclosure, the shift register comprised in the gate driving circuit and alternatively the display device is arranged with the discharge auxiliary unit and the discharge driving unit, such that after the scanning by the gate driving circuit finishes, the discharge driving unit can, according to the control of the discharge control signal, pull high the potential of the gate line connected with the signal output terminal of the shift register and output it, and it is pulled low again by the reset unit.

An embodiment of the disclosure further provides a method for driving a shift register, which is used for driving a shift register as described in any of the above embodiments, and comprises: providing a first clock signal, a second clock signal, an initial trigger signal, a low level signal, a reset signal and a discharge control signal by a first clock signal terminal, a second clock signal terminal, a trigger signal terminal, a low level signal terminal, a reset signal terminal and a discharge control signal terminal in a one-to-one correspondence relationship, wherein the first clock signal and the second clock signal are complementary pulse signals, the initial trigger signal has trigger high level pulses which are spaced and identical to two clock high level pulses of the second clock signal having the same interval, the reset signal has two reset high level pulses which are spaced, the former one of the reset high level pulses falls behind the former one of the trigger high level pulses of the initial trigger signal by one clock cycle, and the latter one of the reset high level pulses is synchronized to the latter one of the trigger high level pulses, the discharge control signal has a discharge high level pulse with a duration which is the duration of one said clock cycle, the rising edge of the discharge high level pulse precedes the rising edge of the latter one of the trigger high level pulses by half the clock cycle, and the falling edge of the discharge high level pulse is synchronized to the falling edge of the latter one of the trigger high level pulses, wherein the clock cycle is the cycle of the first clock signal and the second clock signal.

DETAILED DESCRIPTION

Figure 1:
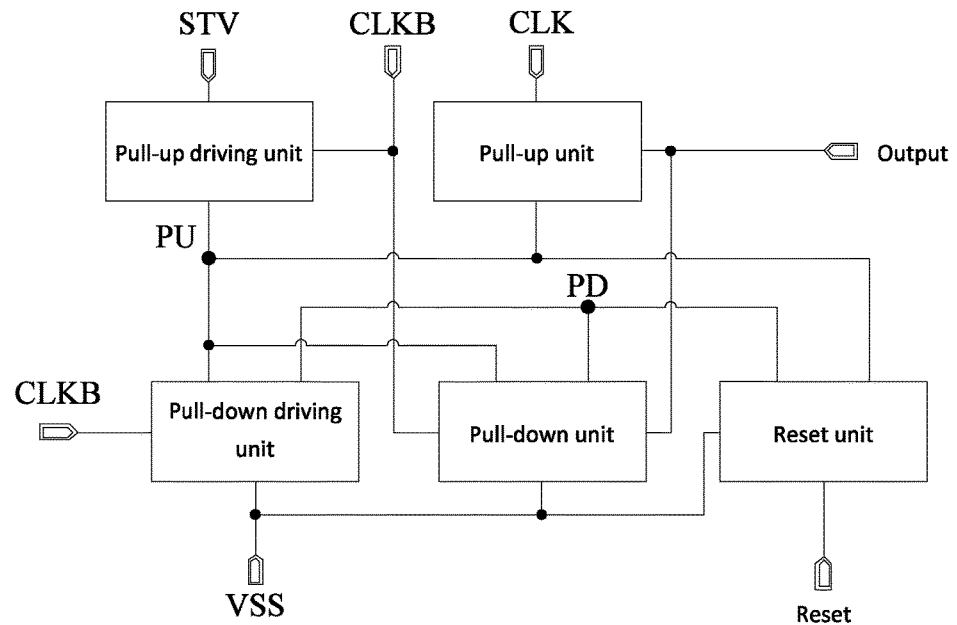
FIG. 1 is a structure diagram of a shift register in the prior art.

In the following the implementation process of the embodiments of the disclosure will be described in detail in conjunction with the drawings of the specification. It needs to be noted that, identical or similar reference signs denote identical or similar elements or elements that have identical or similar functions throughout. In the following, the embodiments described with reference to the drawing are exemplary, only used for explaining the invention, and may not be construed as limiting the invention.

Figure 2:
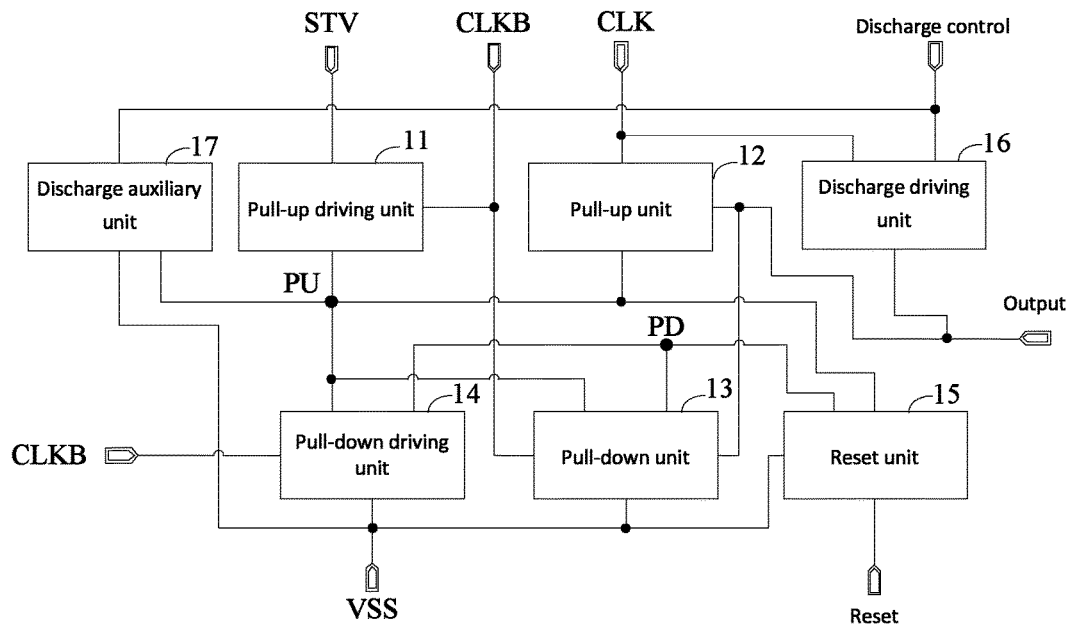
FIG. 2 is a structure diagram of a shift register provided by an embodiment of the disclosure.

With reference to FIG. 2, an embodiment of the disclosure provides a shift register comprising a pull-up driving unit 11, a pull-up unit 12, a pull-down unit 13, a pull-down driving unit 14 and a reset unit 15, the pull-up driving unit 11 being connected with the pull-up unit 12 via a pull-up node PU, the reset unit 15 being used for pulling low the potential of a gate line connected with a signal output terminal of the shift register after normal outputting by the shift register finishes, the shift register further comprising a discharge auxiliary unit 17, a discharge driving unit 16 and a discharge control signal terminal, wherein the discharge auxiliary unit 17 is used for pulling low the potential of the pull-up node PU according to a discharge control signal inputted by the discharge control signal terminal, the discharge driving unit 16 is used for pulling high the potential of the gate line connected with the signal output terminal of the shift register according to the discharge control signal inputted by the discharge control signal terminal, and the reset unit 15 is further used for pulling low again the potential of the gate line connected with the signal output terminal of the shift register, after the discharge driving unit 16 pulls high the potential of the gate line connected with the signal output terminal of the shift register and the outputting of it finishes.

In the embodiment of the disclosure, the shift register is arranged with the discharge auxiliary unit 17 and the discharge driving unit 16, such that after the scanning by the gate driving circuit finishes, the discharge driving unit 16 can, according to the control of the discharge control signal, pull high the potential of the gate line connected with the signal output terminal of the shift register and output it, and it is pulled low again by the reset unit 15.

Figure 3:
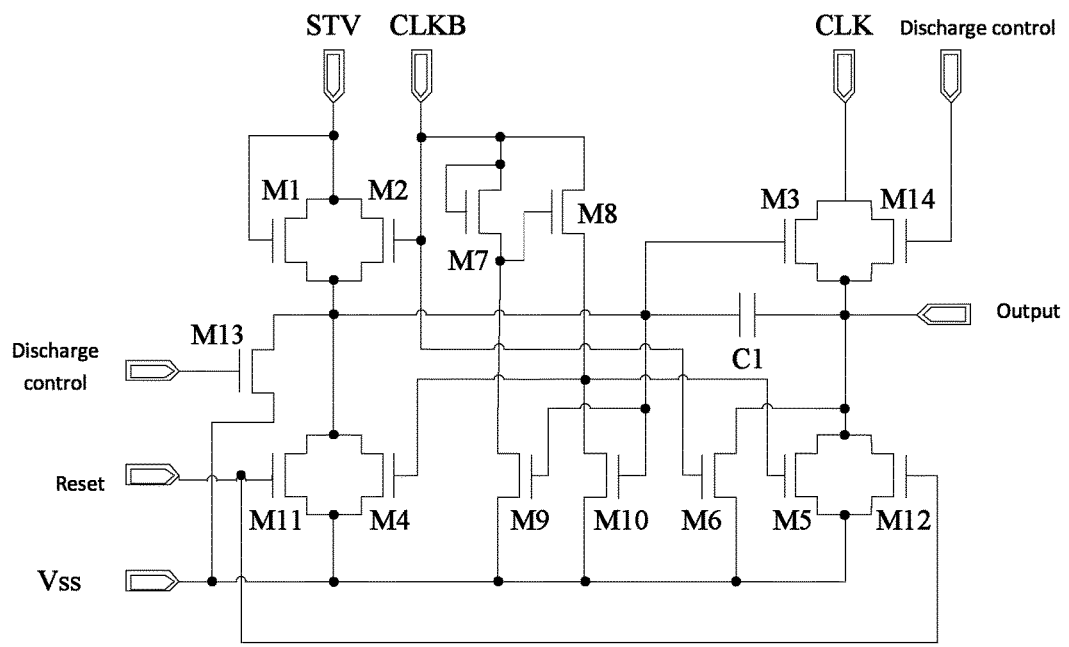
FIG. 3 is a structure diagram of a specific shift register provided by an embodiment of the disclosure.

A specific shift register is provided in conjunction with FIG. 2, as shown in FIG. 3: the pull-up driving unit 11 comprises a first thin film transistor M1 and a second thin film transistor M2, the gate and the drain of the first thin film transistor M1 and the drain of the second thin film transistor M2 are electrically connected with a trigger signal terminal STV, the source of the first thin film transistor M1 and the source of the second thin film transistor M2 are electrically connected with the pull-up node PU, and the gate of the second thin film transistor M2 is electrically connected with a second clock signal terminal CLKB the pull-up unit 12 comprises a third thin film transistor M3 and a capacitor C1, the gate of the third thin film transistor M3 and a first terminal of the capacitor C1 are electrically connected with the pull-up node PU, the drain of the third thin film transistor M3 is electrically connected with a first clock signal terminal CLK, and the source of the third thin film transistor M3 and a second terminal of the capacitor C1 are electrically connected with the signal output terminal, the pull-down unit 13 comprises a fourth thin film transistor M4, a fifth thin film transistor M5 and a sixth thin film transistor M6, the gate of the fourth thin film transistor M4 and the gate of the fifth thin film transistor M5 are electrically connected with the pull-down node PD, the drain of the fourth thin film transistor M4 is electrically connected with the pull-up node PU, the source of the fourth thin film transistor M4, the source of the fifth thin film transistor M5 and the source of the sixth thin film transistor M6 are electrically connected with a low level signal terminal VSS, the drain of the fifth thin film transistor M5 and the drain of the sixth thin film transistor M6 are electrically connected with the signal output terminal, and the gate of the sixth thin film transistor M6 is electrically connected with the second clock signal terminal CLKB the pull-down driving unit 14 comprises a seventh thin film transistor M7, an eighth thin film transistor M8, a ninth thin film transistor M9 and a tenth thin film transistor M10, the gate and the drain of the seventh thin film transistor M7 and the drain of the eighth thin film transistor M8 are electrically connected with the second clock signal terminal CLKB, the source of the seventh thin film transistor M7, the gate of the eighth thin film transistor M8 and the drain of the ninth thin film transistor M9 are electrically connected, the source of the eighth thin film transistor M8 and the drain of the tenth thin film transistor M10 are electrically connected with the pull-down node PD, the gate of the ninth thin film transistor M9 and the gate of the tenth thin film transistor M10 are electrically connected with the pull-up node PU, and the source of the ninth thin film transistor M9 and the source of the tenth thin film transistor M10 are electrically connected with the low level signal terminal VSS, and the reset unit 15 comprises an eleventh thin film transistor M11 and a twelfth thin film transistor M12, the gate of the eleventh thin film transistor M11 and the gate of the twelfth thin film transistor M12 are electrically connected with a reset signal terminal, the drain of the eleventh thin film transistor M11 is electrically connected with the pull-up node PU, the source of the eleventh thin film transistor M11 and the source of the twelfth thin film transistor M12 are electrically connected with the low level signal terminal VSS, and the drain of the twelfth thin film transistor M12 is electrically connected with the signal output terminal.

Optionally, the discharge auxiliary unit 17 comprises a thirteenth thin film transistor M13, the gate of the thirteenth thin film transistor M13 is connected with the discharge control signal terminal, the drain of the thirteenth thin film transistor M13 is connected with the pull-up node PU, and the source of the thirteenth thin film transistor M13 is electrically connected with the low level signal terminal VSS.

Optionally, the discharge driving unit 16 comprises a fourteenth thin film transistor M14, the gate of the fourteenth thin film transistor M14 is electrically connected with the discharge control signal terminal, the drain of the fourteenth thin film transistor M14 is electrically connected with the first clock signal terminal CLK, and the source of the fourteenth thin film transistor M14 is electrically connected with the signal output terminal.

Optionally, all of the above thin film transistors (e.g., the first thin film transistor M1 to the fourteenth thin film transistor M14) are N-type thin film transistors.

Figure 4:
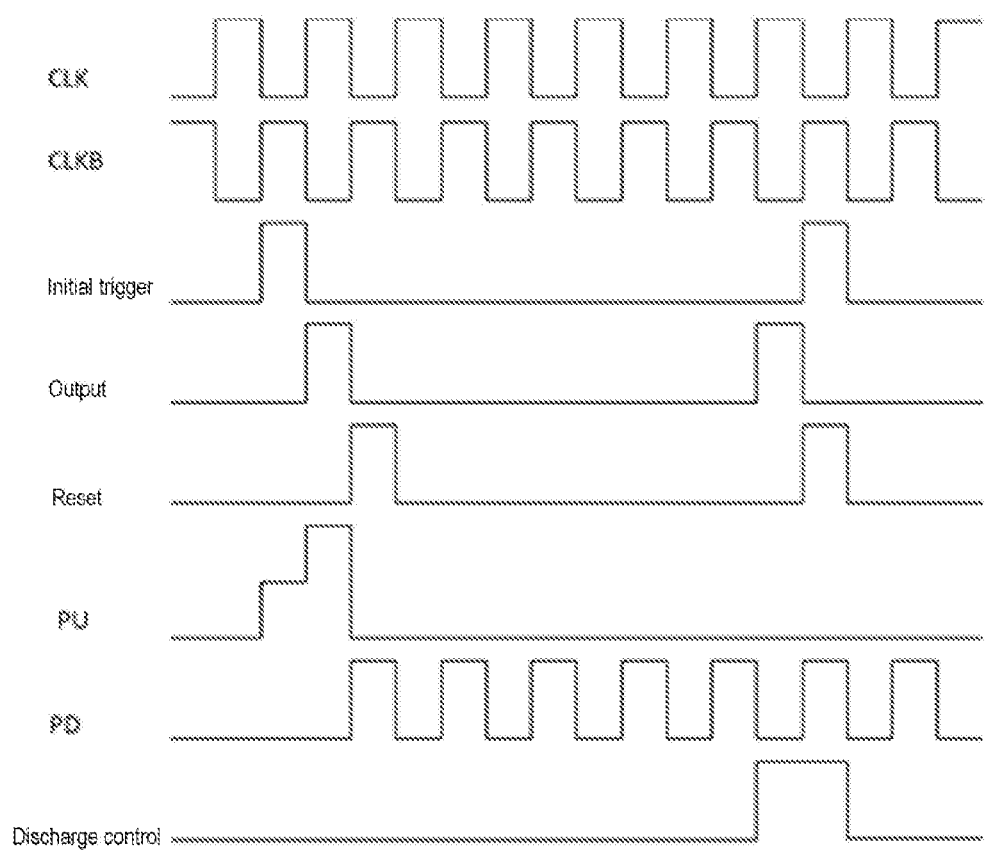
FIG. 4 is a timing diagram of a specific shift register provided by an embodiment of the disclosure.

It needs to be noted that, in order to be able to both accomplish normal scanning and discharge, it is necessary to adaptively change various inputted signals, and for the shift register as shown in FIG. 3, a timing as shown in FIG. 4 may be provided, in which a transferred corresponding signal is named by the reference sign of a signal terminal, and which is as follows.

The first clock signal CLK and the second clock signal CLKB are complementary pulse signals, the initial trigger signal STV has trigger high level pulses which are spaced and identical to two clock high level pulses of the second clock signal CLKB having the same interval, the reset signal has two reset high level pulses which are spaced, the former one of the reset high level pulses falls behind the former one of the trigger high level pulses of the initial trigger signal STV by one clock cycle, and the latter one of the reset high level pulses is synchronized to the latter one of the trigger high level pulses of the STV, the discharge control signal has a discharge high level pulse with a duration which is the duration of the clock cycle t, the rising edge of the discharge high level pulse precedes the rising edge of the latter one of the trigger high level pulses by half the clock cycle t, and the falling edge of the discharge high level pulse is synchronized to the falling edge of the latter one of the trigger high level pulses, wherein the clock cycle t is the cycle of the first clock signal CLK and the second clock signal CLKB.

In the embodiment of the disclosure, the shift register is arranged with the discharge auxiliary unit and the discharge driving unit, such that after the scanning by the gate driving circuit finishes, the discharge driving unit can, according to the control of the discharge control signal, pull high the potential of the gate line connected with the signal output terminal of the shift register and output it, and it is pulled low again by the reset unit.

Figure 5:
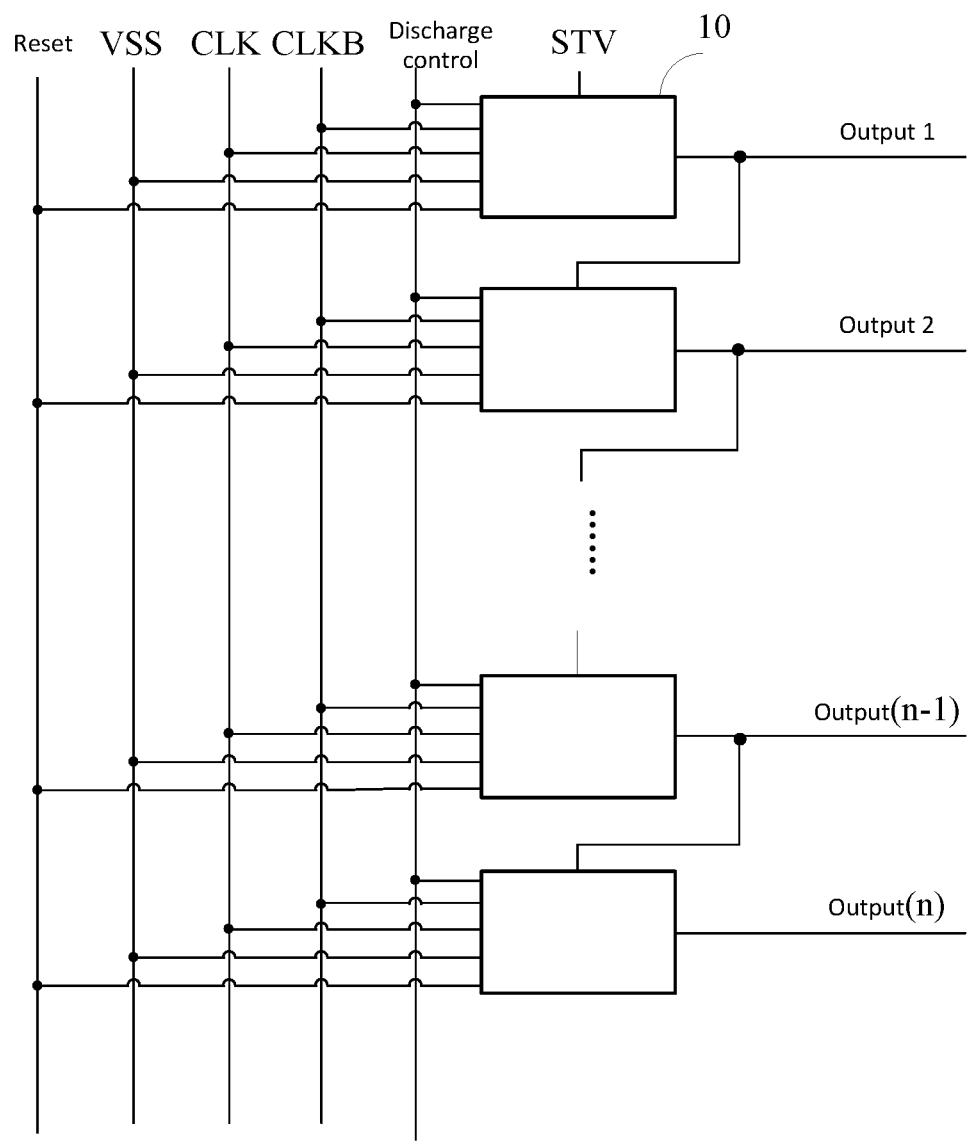
FIG. 5 is a structure diagram of a gate driving circuit provided by an embodiment of the disclosure.

With reference to FIG. 5, an embodiment of the disclosure further provides a gate driving circuit comprising a plurality of cascaded shift registers 10. For the shift registers 10, reference is made to the shift registers as shown in FIG. 2 and FIG. 3. The outputs of the shift registers 10 are successively 1, 2, . . . , (n–1) and (n).

Optionally, the gate driving circuit further comprises a discharge control signal line for providing the discharge control signal terminal of the shift register 10 with a discharge control signal to control the discharge auxiliary unit and the discharge driving unit, and the discharge control signal is kept at a low level during the scanning by the gate driving circuit, and provides a high level of a clock cycle after the scanning by the gate driving circuit finishes, which clock cycle is the cycle of the clock signal in the shift register 10.

It needs to be noted that, in FIG. 5, signal lines marked with VSS, CLK, CLKB, STV, Reset, Discharge control are all marked with the names of corresponding signal terminals of the shift register 10, which will not be repeated here.

A specific implementation of the individual shift register units 10 of the gate driving circuit discharging the liquid crystal capacitors is as follows. When the discharge control signal terminals receive a high level signal, the thirteenth thin film transistors M13 and the fourteenth thin film transistors M14 of all the shift register units 10 are turned on, M14 cause the signal output terminals to receive the first clock signal (a level pulse of one clock cycle) at the first clock signal terminal CLK, that is, neighboring shift register units 10 output high levels for half a cycle in one clock cycle, which thereby achieves the objective that the liquid crystal capacitors of all the pixels are all discharged, and the thirteenth thin film transistors M13 cause the pull-up nodes PU to remain at a low level so as not to affect the normal operation of the individual shift register units 10 for the next frame.

An embodiment of the disclosure further provides a display device comprising the gate driving circuit as provided by the above embodiment.

In the embodiment of the disclosure, the shift register comprised in the gate driving circuit and alternatively the display device is arranged with the discharge auxiliary unit and the discharge driving unit, such that after the scanning by the gate driving circuit finishes, the discharge driving unit can, according to the control of the discharge control signal, pull high the potential of the gate line connected with the signal output terminal of the shift register and output it, and it is pulled low again by the reset unit.

An embodiment of the disclosure further provides a method for driving a shift register, which is used for driving a shift register as described in the above embodiments, and comprises: providing a first clock signal, a second clock signal, an initial trigger signal, a low level signal, a reset signal and a discharge control signal by a first clock signal terminal, a second clock signal terminal, a trigger signal terminal, a low level signal terminal, a reset signal terminal and a discharge control signal terminal in a one-to-one correspondence relationship, wherein the first clock signal and the second clock signal are complementary pulse signals, the initial trigger signal has trigger high level pulses which are spaced and identical to two clock high level pulses of the second clock signal having the same interval, the reset signal has two reset high level pulses which are spaced, the former one of the reset high level pulses falls behind the former one of the trigger high level pulses of the initial trigger signal by one clock cycle, and the latter one of the reset high level pulses is synchronized to the latter one of the trigger high level pulses, the discharge control signal has a discharge high level pulse with a duration which is the duration of one said clock cycle, the rising edge of the discharge high level pulse precedes the rising edge of the latter one of the trigger high level pulses by half the clock cycle, and the falling edge of the discharge high level pulse is synchronized to the falling edge of the latter one of the trigger high level pulses, wherein the clock cycle is the cycle of the first clock signal and the second clock signal.

The beneficial effects of the embodiments of the disclosure are as follows. The shift register comprised in the gate driving circuit and alternatively the display device is arranged with the discharge auxiliary unit and the discharge driving unit, such that after the scanning by the gate driving circuit finishes, the discharge driving unit can, according to the control of the discharge control signal, pull high the potential of the gate line connected with the signal output terminal of the shift register and output it, and it is pulled low again by the reset unit.

Clearly, various modifications and variations may be made to the invention by the person having ordinary skills in the art without departing from the spirit and scope of the invention. As such, the invention is also intended to include these modifications and variations, if the modifications and variations of the invention pertain to the scope of the claims of the invention and the equivalence thereof.

The invention claimed is:

1. A shift register comprising a pull-up driving unit, a pull-up unit, a pull-down unit, a pull-down driving unit and a reset unit, the pull-up driving unit being connected with the pull-up unit via a pull-up node, the reset unit being used for pulling low the potential of a gate line connected with a signal output terminal of the shift register after normal outputting by the shift register finishes, wherein the shift register further comprises a discharge auxiliary unit, a discharge driving unit and a discharge control signal terminal, wherein the discharge auxiliary unit is used for pulling low the potential of the pull-up node according to a discharge control signal inputted by the discharge control signal terminal, the discharge driving unit is used for pulling high the potential of the gate line connected with the signal output terminal of the shift register according to the discharge control signal inputted by the discharge control signal terminal, and the reset unit is further used for pulling low again the potential of the gate line connected with the signal output terminal of the shift register, after the discharge driving unit pulls high the potential of the gate line connected with the signal output terminal of the shift register and the outputting of it finishes.

2. The shift register as claimed in claim 1, wherein the discharge auxiliary unit comprises a thirteenth thin film transistor, the gate of the thirteenth thin film transistor is connected with the discharge control signal terminal, the drain of the thirteenth thin film transistor is connected with the pull-up node, and the source of the thirteenth thin film transistor is electrically connected with a low level signal terminal.

3. The shift register as claimed in claim 1, wherein the discharge driving unit comprises a fourteenth thin film transistor, the gate of the fourteenth thin film transistor is electrically connected with the discharge control signal terminal, the drain of the fourteenth thin film transistor is electrically connected with a first clock signal terminal, and the source of the fourteenth thin film transistor is electrically connected with the signal output terminal.

4. The shift register as claimed in claim 1, wherein
the pull-up driving unit comprises a first thin film transistor and a second thin film transistor, the gate and the drain of the first thin film transistor and the drain of the second thin film transistor are electrically connected with a trigger signal terminal, the source of the first thin film transistor and the source of the second thin film transistor are electrically connected with the pull-up node, and the gate of the second thin film transistor is electrically connected with a second clock signal terminal,
the pull-up unit comprises a third thin film transistor and a capacitor, the gate of the third thin film transistor and a first terminal of the capacitor are electrically connected with the pull-up node, the drain of the third thin film transistor is electrically connected with a first clock signal terminal, and the source of the third thin film transistor and a second terminal of the capacitor are electrically connected with the signal output terminal,
the pull-down unit comprises a fourth thin film transistor, a fifth thin film transistor and a sixth thin film transistor, the gate of the fourth thin film transistor and the gate of the fifth thin film transistor are electrically connected with the pull-down node, the drain of the fourth thin film transistor is electrically connected with the pull-up node, the source of the fourth thin film transistor, the source of the fifth thin film transistor and the source of the sixth thin film transistor are electrically connected with a low level signal terminal, the drain of the fifth thin film transistor and the drain of the sixth thin film transistor are electrically connected with the signal output terminal, and the gate of the sixth thin film transistor is electrically connected with the second clock signal terminal,
the pull-down driving unit comprises a seventh thin film transistor, an eighth thin film transistor, a ninth thin film transistor and a tenth thin film transistor, the gate and the drain of the seventh thin film transistor and the drain of the eighth thin film transistor are electrically connected with the second clock signal terminal, the source of the seventh thin film transistor, the gate of the eighth thin film transistor and the drain of the ninth thin film transistor are electrically connected, the source of the eighth thin film transistor and the drain of the tenth thin film transistor are electrically connected with the pull-down node, the gate of the ninth thin film transistor and the gate of the tenth thin film transistor are electrically connected with the pull-up node, and the source of the ninth thin film transistor and the source of the tenth thin film transistor are electrically connected with the low level signal terminal, and
the reset unit comprises an eleventh thin film transistor and a twelfth thin film transistor, the gate of the eleventh thin film transistor and the gate of the twelfth thin film transistor are electrically connected with a reset signal terminal, the drain of the eleventh thin film transistor is electrically connected with the pull-up node, the source of the eleventh thin film transistor and the source of the twelfth thin film transistor are electrically connected with the low level signal terminal, and the drain of the twelfth thin film transistor is electrically connected with the signal output terminal.

5. The shift register as claimed in claim 4, wherein all of the above thin film transistors are N-type thin film transistors.

6. A gate driving circuit, comprising a plurality of cascaded shift registers, wherein the shift registers are shift registers as claimed in claim 1.

7. The gate driving circuit as claimed in claim 6, wherein it further comprises a discharge control signal line for providing the discharge control signal terminal of the shift register with the discharge control signal to control the discharge auxiliary unit and the discharge driving unit, and
the discharge control signal is kept at a low level during the scanning by the gate driving circuit, and provides a high level of a clock cycle after the scanning by the gate driving circuit finishes, which clock cycle is the cycle of a clock signal in the shift register.

8. A display device, comprising the gate driving circuit as claimed in claim 7.

9. A display device, comprising the gate driving circuit as claimed in claim 6.

10. A method for driving a shift register, which is used for driving a shift register as claimed in claim 1, wherein it comprises:
providing a first clock signal, a second clock signal, an initial trigger signal, a low level signal, a reset signal and the discharge control signal by a first clock signal terminal, a second clock signal terminal, a trigger signal terminal, a low level signal terminal, a reset signal terminal and the discharge control signal terminal in a one-to-one correspondence relationship, wherein
the first clock signal and the second clock signal are complementary pulse signals, the initial trigger signal has two trigger high level pulses which are spaced and identical to two clock high level pulses of the second clock signal having the same interval, the reset signal has two reset high level pulses which are spaced, the former one of the reset high level pulses falls behind the former one of the trigger high level pulses of the initial trigger signal by one clock cycle, and the latter one of the reset high level pulses is synchronized to the latter one of the trigger high level pulses, the discharge control signal has a discharge high level pulse with a duration which is the duration of one said clock cycle, the rising edge of the discharge high level pulse precedes the rising edge of the latter one of the trigger high level pulses by half the clock cycle, and the falling edge of the discharge high level pulse is synchronized to the falling edge of the latter one of the trigger high level pulses, wherein the clock cycle is the cycle of the first clock signal and the second clock signal.

11. The method of claim 10, wherein the discharge auxiliary unit comprises a thirteenth thin film transistor, the gate of the thirteenth thin film transistor is connected with the discharge control signal terminal, the drain of the thirteenth thin film transistor is connected with the pull-up node, and the source of the thirteenth thin film transistor is electrically connected with the low level signal terminal.

12. The method of claim 10, wherein the discharge driving unit comprises a fourteenth thin film transistor, the gate of the fourteenth thin film transistor is electrically connected with the discharge control signal terminal, the drain of the fourteenth thin film transistor is electrically connected with the first clock signal terminal, and the source of the fourteenth thin film transistor is electrically connected with the signal output terminal.

13. The method of claim 10, wherein the pull-up driving unit comprises a first thin film transistor and a second thin film transistor, the gate and the drain of the first thin film transistor and the drain of the second thin film transistor are electrically connected with the trigger signal terminal, the source of the first thin film transistor and the source of the second thin film transistor are electrically connected with the pull-up node, and the gate of the second thin film transistor is electrically connected with the second clock signal terminal, the pull-up unit comprises a third thin film transistor and a capacitor, the gate of the third thin film transistor and a first terminal of the capacitor are electrically connected with the pull-up node, the drain of the third thin film transistor is electrically connected with the first clock signal terminal, and the source of the third thin film transistor and a second terminal of the capacitor are electrically connected with the signal output terminal, the pull-down unit comprises a fourth thin film transistor, a fifth thin film transistor and a sixth thin film transistor, the gate of the fourth thin film transistor and the gate of the fifth thin film transistor are electrically connected with the pull-down node, the drain of the fourth thin film transistor is electrically connected with the pull-up node, the source of the fourth thin film transistor, the source of the fifth thin film transistor and the source of the sixth thin film transistor are electrically connected with the low level signal terminal, the drain of the fifth thin film transistor and the drain of the sixth thin film transistor are electrically connected with the signal output terminal, and the gate of the sixth thin film transistor is electrically connected with the second clock signal terminal, the pull-down driving unit comprises a seventh thin film transistor, an eighth thin film transistor, a ninth thin film transistor and a tenth thin film transistor, the gate and the drain of the seventh thin film transistor and the drain of the eighth thin film transistor are electrically connected with the second clock signal terminal, the source of the seventh thin film transistor, the gate of the eighth thin film transistor and the drain of the ninth thin film transistor are electrically connected, the source of the eighth thin film transistor and the drain of the tenth thin film transistor are electrically connected with the pull-down node, the gate of the ninth thin film transistor and the gate of the tenth thin film transistor are electrically connected with the pull-up node, and the source of the ninth thin film transistor and the source of the tenth thin film transistor are electrically connected with the low level signal terminal, and the reset unit comprises an eleventh thin film transistor and a twelfth thin film transistor, the gate of the eleventh thin film transistor and the gate of the twelfth thin film transistor are electrically connected with the reset signal terminal, the drain of the eleventh thin film transistor is electrically connected with the pull-up node, the source of the eleventh thin film transistor and the source of the twelfth thin film transistor are electrically connected with the low level signal terminal, and the drain of the twelfth thin film transistor is electrically connected with the signal output terminal.

14. The method of claim 13, wherein all of the above thin film transistors are N-type thin film transistors.

\* \* \* \* \*